United States Patent
Horiguchi et al.

(10) Patent No.: US 9,882,511 B2
(45) Date of Patent: *Jan. 30, 2018

(54) PIEZOELECTRIC POWER GENERATION MODULE AND REMOTE CONTROLLER

(71) Applicant: Murata Manufacturing Co., Ltd., Nagaokakyo-shi, Kyoto-fu (JP)

(72) Inventors: Chikahiro Horiguchi, Nagaokakyo (JP); Kohei Takahashi, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/198,382

(22) Filed: Jun. 30, 2016

(65) Prior Publication Data

US 2016/0308469 A1    Oct. 20, 2016

Related U.S. Application Data

(63) Continuation of application No. PCT/JP2014/077669, filed on Oct. 17, 2014.

(30) Foreign Application Priority Data

Jan. 22, 2014    (JP) .................................. 2014-009596

(51) Int. Cl.
*G08B 21/00*    (2006.01)
*H02N 2/18*    (2006.01)
(Continued)

(52) U.S. Cl.
CPC ............. *H02N 2/181* (2013.01); *G08C 17/02* (2013.01); *G08C 2201/112* (2013.01); *H01L 41/1134* (2013.01)

(58) Field of Classification Search
CPC .............. G08C 17/02; G08C 2201/112; H01L 41/1134; H02N 2/181
(Continued)

(56) References Cited

U.S. PATENT DOCUMENTS 5,796,206 A    8/1998    Asai et al.
6,259,372 B1    7/2001    Taranowski et al.
(Continued)

FOREIGN PATENT DOCUMENTS

JP    H07245970 A    9/1995
JP    H1118458 A    1/1999
(Continued)

OTHER PUBLICATIONS

International Search Report issued for PCT/JP2014/077669, dated Dec. 16, 2014.
(Continued)

*Primary Examiner* — Mark Rushing
(74) *Attorney, Agent, or Firm* — Arent Fox LLP (57) ABSTRACT

A piezoelectric device is connected in parallel with a diode, and outputs a power generation voltage when depressed. When the power generation voltage exceeds a first threshold voltage, a load switch control circuit makes a load switch be conductive, and when the generated voltage becomes lower than a second threshold voltage, the load switch is cut off. Further, when depression is released, the piezoelectric device is discharged by the diode such that the amount of charge remaining in the piezoelectric device becomes zero.

17 Claims, 6 Drawing Sheets

(51) Int. Cl.
*G08C 17/02* (2006.01)
*H01L 41/113* (2006.01)

(58) Field of Classification Search
USPC ........................................ 341/176; 340/12.22
See application file for complete search history.

(56) References Cited

U.S. PATENT DOCUMENTS

| | | | |
|---|---|---|---|
| 6,861,785 B2 * | 3/2005 | Andre | ................. H02N 2/18 |
| | | | 310/317 |
| 7,005,780 B2 | 2/2006 | Sakai | |
| 7,781,943 B1 | 8/2010 | Hamel et al. | |
| 2004/0251789 A1 | 12/2004 | Sakai | |
| 2006/0006991 A1 | 1/2006 | Tyndall et al. | |
| 2008/0252174 A1 * | 10/2008 | Mohammadi | ............ G01L 1/16 |
| | | | 310/319 |
| 2010/0133954 A1 | 6/2010 | Despesse | |
| 2011/0109201 A1 | 5/2011 | Ozawa et al. | |
| 2012/0280596 A1 * | 11/2012 | Ide | .................. H02N 2/181 |
| | | | 310/319 |
| 2013/0082570 A1 * | 4/2013 | Ide | .................. H02N 2/188 |
| | | | 310/319 |

FOREIGN PATENT DOCUMENTS

| | | |
|---|---|---|
| JP | 2003007491 A | 1/2003 |
| JP | 2004103265 A | 4/2004 |
| JP | 2004201376 A | 7/2004 |
| JP | 2011103729 A | 5/2011 |
| JP | 2012254005 A | 12/2012 |
| JP | 2013081281 A | 5/2013 |
| WO | WO 0325969 A1 | 3/2003 |

OTHER PUBLICATIONS

Written Opinion of the International Searching Authority issued for PCT/JP2014/077669, dated Dec. 16, 2014.

* cited by examiner

PIEZOELECTRIC POWER GENERATION MODULE AND REMOTE CONTROLLER

CROSS REFERENCE TO RELATED APPLICATIONS

The present application is a continuation of PCT/JP2014/077669 filed Oct. 17, 2014, which claims priority to Japanese Patent Application No. 2014-009596, filed Jan. 22, 2014, the entire contents of each of which are incorporated herein by reference.

TECHNICAL FIELD

The present disclosure relates to a piezoelectric power generation module and to a remote controller including the same. For example, the present disclosure relates to a piezoelectric power generation module that converts mechanical energy applied to a piezoelectric device into electrical energy and supplies power to a processing circuit, and relates to a remote controller.

BACKGROUND

Currently, there are remote controllers that include a piezoelectric device and do require a battery. For example, Japanese Unexamined Patent Application Publication No. 2011-103729 (Patent Document 1) discloses a configuration of a remote controller which has a power generation capability and which, after detecting that an input unit depressed by the finger of a user has recovered, executes an input command. The remote controller converts AC power generated when the input unit is depressed and when the input unit recovers therefrom into DC power by using a rectifier unit, and stores the DC power in a power storage unit (capacitor). Moreover, Japanese Unexamined Patent Application Publication No. 2004-201376 (Patent Document 2) discloses a configuration in which AC power generated by letting the free end of an actuator freely vibrate is converted into DC power by a rectifier.

Patent Document 1: Japanese Unexamined Patent Application Publication No. 2011-103729.

Patent Document 2: Japanese Unexamined Patent Application Publication No. 2004-201376.

In Patent Document 1 and Patent Document 2, a charge generated by a piezoelectric device is rectified by a full-wave rectifier circuit and provided to a capacitor serving as a power storage unit. With respect to a reference potential which is a potential in a state in which the piezoelectric device is not deformed, a full-wave rectifier circuit can supply to a subsequent circuit both a charge generated at a positive potential obtained as a result of the piezoelectric device deforming to the first main surface side and a charge generated at a negative potential obtained as a result of the piezoelectric device deforming to the second main surface side when the plate-shaped piezoelectric device deforms. However, energy loss accompanying this movement of charges is generated in the full-wave rectifier circuit and, hence, there is a problem in that the ratio (energy efficiency) of available energy to generated energy is low.

SUMMARY OF THE INVENTION

A piezoelectric power generation module is disclosed that includes a piezoelectric device including a first terminal and a second terminal; a diode including a cathode connected to the first terminal of the piezoelectric device and an anode connected to the second terminal of the piezoelectric device; a switch control circuit including a first input terminal connected to the cathode, a second input terminal connected to the anode, and an output terminal outputting a switch control signal; and a first switch that is connected to the first input terminal of the switch control circuit and that switches between a conductive state and a cut off state in response to the switch control signal.

With this configuration, since a nonlinear device (e.g., a diode) is not connected in series between the piezoelectric device and the switch control circuit, energy loss encountered while a charge generated by the piezoelectric device moves can be reduced. Further, since a diode that clamps a voltage that is negative with respect to a reference potential is provided in parallel with the piezoelectric device between the piezoelectric device and the switch control circuit, the charge of the piezoelectric device can be quickly released when the voltage across the piezoelectric device becomes lower than or equal to the reference potential. This avoids a problem in that, even when a charge generated in the piezoelectric device for the first time is supplied to a subsequent stage, stable driving cannot be performed due to a decrease in the reference potential at a subsequent time. As a result, the disclosure provides a piezoelectric power generation module enabling stable driving and having satisfactory energy efficiency.

Preferably, the piezoelectric device is a power generating device, and the first switch enters a conductive state as a result of a voltage across the piezoelectric device exceeding a first threshold voltage larger than a reference potential, and the first switch enters a cut off state as a result of the voltage across the piezoelectric device becoming a second threshold voltage lower than the first threshold voltage.

Preferably, the piezoelectric device causes a voltage to be generated at the first terminal of the piezoelectric device as a result of a load being applied to the piezoelectric device, and the voltage across the piezoelectric device becomes the reference potential when the load applied to the piezoelectric device is released.

Preferably, the switch control circuit includes a comparator circuit and a temperature compensation device, and the temperature compensation device is connected in parallel with the first input terminal and the second input terminal of the switch control circuit.

As a result, the temperature dependency of generated energy and a power generation voltage can be reduced.

Preferably, the switch control circuit further includes a second switch, the second switch is connected in parallel with the temperature compensation device, and the second switch switches between on and off in synchronization with a state of the first switch.

As a result, the temperature dependency after a voltage at the first terminal of the piezoelectric device having become the first threshold voltage can be reduced and, hence, energy efficiency is further increased.

Preferably, the piezoelectric power generation module further includes a capacitor device connected in parallel with the first input terminal and the second input terminal of the switch control circuit.

As a result, a voltage supplied to a stage subsequent to the switch can be controlled more accurately.

A remote controller based on the present disclosure includes the piezoelectric power generation module and an RF circuit, and the RF circuit performs communication processing during a period after a voltage at the first terminal of the piezoelectric device exceeds the first threshold voltage and before the voltage at the first terminal of the piezoelectric device reaches the second threshold voltage.

With this configuration, since a nonlinear device (e.g., a diode) is not provided in series between the piezoelectric device and the switch control circuit, energy loss encountered while a charge generated by the piezoelectric device moves can be reduced. Further, since a diode that clamps a voltage that is negative with respect to a reference potential is provided in parallel with the piezoelectric device between the piezoelectric device and the switch control circuit, the charge of the piezoelectric device can be quickly released when the voltage across the piezoelectric device becomes lower than or equal to the reference potential. Hence, a remote controller is provided having stable driving and satisfactory energy efficiency.

A piezoelectric power generation module and a remote controller is provided having stable driving and satisfactory energy efficiency.

DETAILED DESCRIPTION OF THE EXEMPLARY EMBODIMENTS

Hereinafter, embodiments will be described with reference to the drawings. In the description of the embodiments, although the number of units and the amounts that may be used are referred to, the number of units and the amounts that may be used are not limited to these unless specifically described. In the drawings of the embodiments, it is assumed that identical reference symbols or numerals denote identical portions or corresponding portions. Further, in the descriptions of the embodiments, duplicated descriptions of portions and others denoted by the same reference symbols and the like are not repeated in some cases.

<First Embodiment>

Figure 1:
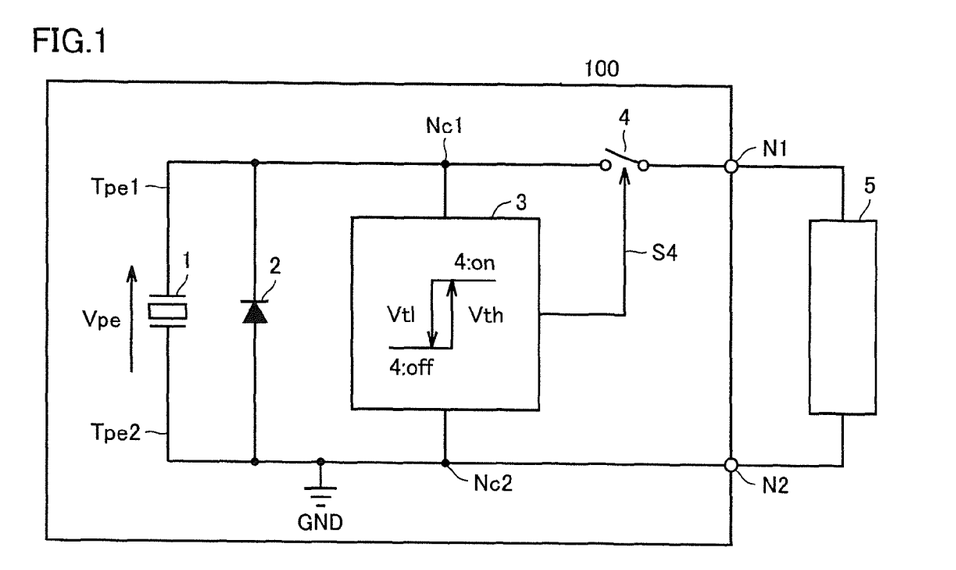
FIG. 1 is a circuit diagram of a piezoelectric power generation module according to a first embodiment.

FIG. 1 is a circuit diagram of a piezoelectric power generation module 100 according to a first embodiment. The terms piezoelectric power generation module and piezoelectric power generation device are used interchangeably herein.

The piezoelectric power generation module 100 includes a piezoelectric device 1, a diode 2, a load switch control circuit 3, a load switch 4, a first signal line Tpe1, a second signal line Tpe2, an output node N1, and an output node N2.

A load 5 is connected between the output node N1 and the output node N2. According to an exemplary embodiment, the load 5 can be connected the output nodes N1 and N2 by conductive wiring, for example, and preferably can be connected and disconnected as a removable connector. According to an exemplary embodiment, the load 5 is a processing circuit such as an RF circuit, a microcomputer, or the like. These processing circuits are supplied with a power supply voltage from the output node N1 and the output node N2 of the piezoelectric power generation module 100, and output a signal (for example, an identification code ID) that controls an electronic apparatus located at a remote position. Hence, a remote controller or a wireless switch is provided as a result of the load 5 being connected to the piezoelectric power generation module 100. It is noted that the load switch control circuit 3 corresponds to the switch control circuit of the present disclosure. Moreover, the load switch 4 corresponds to the switch or the first switch of the present disclosure.

Figures 2A, 2B, 2C:
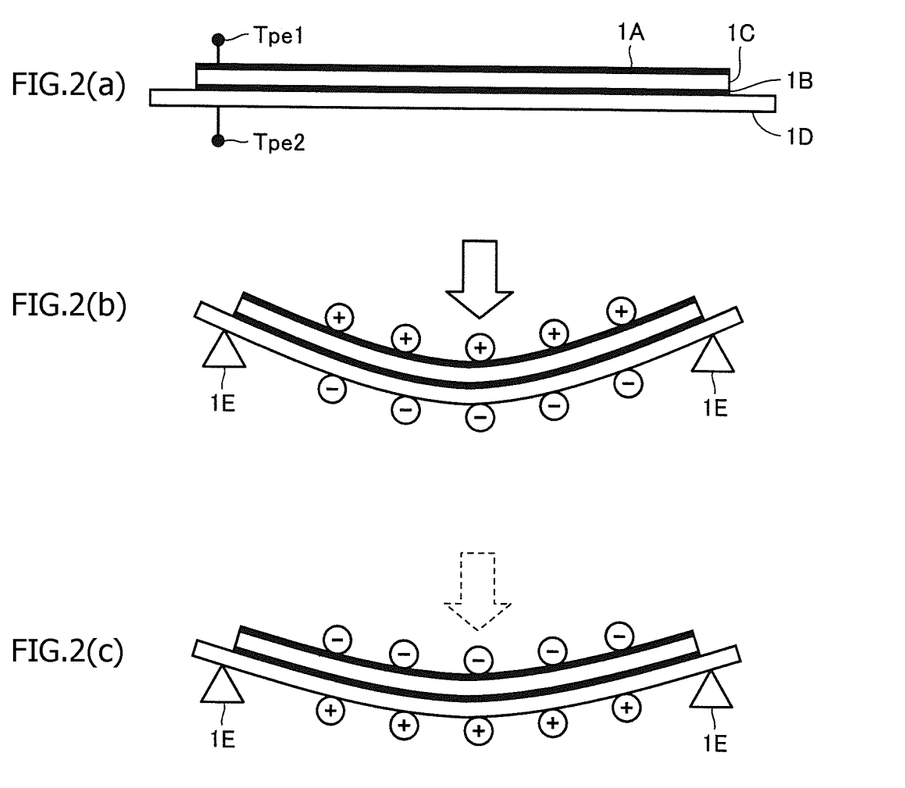
FIGS. 2(a)-2(c) illustrate cross-sectional views illustrating the relationship between a state in which a piezoelectric device included in the piezoelectric power generation module according to the first embodiment is depressed and a generated charge.

FIG. 2(a) is a cross-sectional view schematically illustrating the state of the piezoelectric device 1 to which stress is not being applied. The piezoelectric device 1 includes a piezoelectric body 1C and a metal plate 1D. The piezoelectric body 1C is plate-shaped and is formed of, for example, a lead zirconate titanate ceramic. An electrode 1A is provided on one main surface of the piezoelectric body 1C, and an electrode 1B is provided on the other main surface. In the piezoelectric device 1, the metal plate 1D and the piezoelectric body 1C are electrically united with each other with the electrode 1B therebetween. The electrode 1A is connected to the first signal line Tpe1, and the metal plate 1D is connected to the second signal line Tpe2. The second signal line Tpe2 is connected to a reference potential (GND).

As illustrated in FIG. 2(b), the two ends of the piezoelectric device 1 are held by support units 1E. The piezoelectric device 1 is polarized in a direction indicated by the arrow illustrated in FIG. 2(b). Note that the electrode 1A corresponds to the first terminal of the piezoelectric device of the present disclosure. The electrode 1B corresponds to the second terminal of the piezoelectric device of the present disclosure.

The diode 2 is, for example, a clamp diode. The anode and cathode of the diode 2 are respectively connected to the second signal line Tpe2 and the first signal line Tpe1 of the piezoelectric device 1. In other words, the diode 2 is connected in parallel with the piezoelectric device 1. The diode 2 is provided so that a voltage which is negative with respect to a reference potential, which is a potential in a state in which the piezoelectric device 1 is not deformed, is not applied to the load 5.

A power supply node Nc1 and a power supply node Nc2 of the load switch control circuit 3 are respectively connected to the first signal line Tpe1 and the second signal line Tpe2 of the piezoelectric device 1. The first input terminal of the load switch control circuit 3 is connected to the power supply node Nc1 of the load switch control circuit 3. The second input terminal of the load switch control circuit 3 is connected to the power supply node Nc2. The load switch control circuit 3 outputs a load switch control signal S4 from the output terminal of the load switch control circuit 3 and switches between the conductive state and cut off state of the load switch 4.

Figure 4:
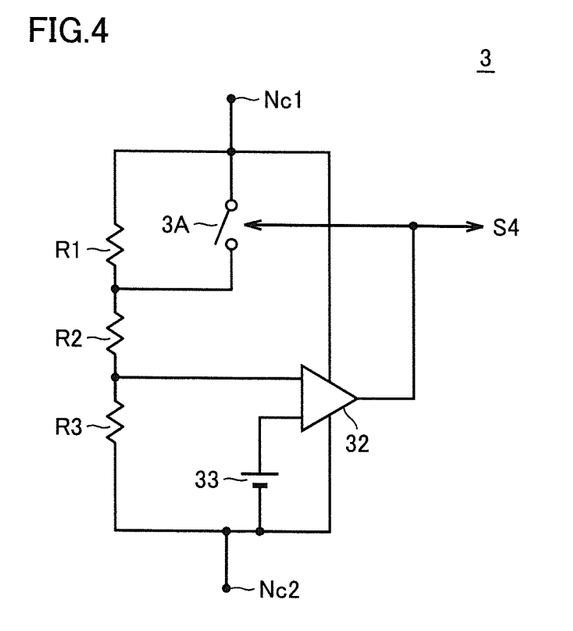
FIG. 4 is a circuit diagram of a load switch control circuit included in the piezoelectric power generation module according to the first embodiment.

FIG. 4 is a circuit diagram of the load switch control circuit 3 included in the piezoelectric power generation module 100 in FIG. 1.

The load switch control circuit 3 is formed of, for example, a CMOS circuit. The load switch control circuit 3 includes a first input terminal connected to the power supply node Nc1, a second input terminal connected to the power supply node Nc2, and an output terminal. The load switch control circuit 3 includes a resistor R1, a resistor R2, and a resistor R3, sequentially connected from the power supply node Nc1 side, between the power supply node Nc1 and the power supply node Nc2. The load switch control circuit 3 includes a switch 3A which is, for example, an electronic switch, a comparison voltage generation circuit 33 which is, for example, a band-gap reference, and a comparator circuit 32 which is, for example, an operational amplifier.

One end of the resistor R1 is connected to the power supply node Nc1 and the other end is connected to one end of the resistor R2. The one end of the resistor R2 is connected to the other end of the resistor R1 and the other end of the resistor R2 is connected to one end of the resistor R3. The one end of the resistor R3 is connected to the other end of the resistor R2 and the other end of the resistor R3 is connected to the power supply node Nc2. One end of the switch 3A is connected to the power supply node Nc1 and the other end is connected to the other end of the resistor R1.

The input terminal of the comparison voltage generation circuit 33 is connected to the power supply node Nc2 and the output terminal is connected to the inverting input terminal of the comparator circuit 32. The non-inverting input terminal of the comparator circuit 32 is connected to the one end of the resistor R3, and the output terminal is connected to the switch 3A and the load switch 4. Note that the switch 3A corresponds to the second switch of the present disclosure.

Preferably, the load switch control circuit 3 is configured such that a change in the output logic level of the load switch control signal S4 for a change in a power generation voltage Vpe input between the power supply node Nc1 and the power supply node Nc2 has hysteresis characteristics. The hysteresis characteristics can be provided based on the conductive state of the switch 3A being switched by the load switch control signal S4 output by the comparator circuit 32.

(Operation of Piezoelectric Device)

FIG. 2(b) schematically illustrates a sectional view of the piezoelectric device 1 in a state in which a load is applied thereto. It should be appreciated that the piezoelectric power generation module 100 can be a handheld device used by a user, for example. Thus, in one embodiment, the application of pressure can be as a result of a push-button switch pushed by user, for example. Thus, pushing and releasing of a push-button switch would result in deformation that generates the voltage according to an exemplary embodiment. By depressing (applying stress to) the center portion of the piezoelectric device 1, mechanical energy is converted into electrical energy. FIG. 2(b) illustrates how the piezoelectric body 1C of the piezoelectric device 1 is polarized due to deformation caused by depression, how a positive charge accumulates on the electrode 1A connected to the first signal line Tpe1, and how a negative charge accumulates on the electrode 1B connected to the second signal line Tpe2. It is noted that the negative charge is illustrated below the metal plate 1D, but corresponds to the charge of the electrode 1B.

FIG. 2(c) illustrates the piezoelectric device 1 being released, that is, how the piezoelectric device 1 returns from the state illustrated in FIG. 2(b) to the state illustrated in FIG. 2(a) in response to stress applied to the piezoelectric device 1 and then released. It is illustrated, in the piezoelectric device 1 during releasing of depression, how a negative charge accumulates on the electrode 1A connected to the first signal line Tpe1 and a negative charge accumulates on the electrode 1B connected to the second signal line Tpe2, in the piezoelectric body 1C. It is noted that the positive charge is illustrated below the metal plate 1D, but corresponds to the charge of the electrode 1B.

When the piezoelectric device 1 is depressed (stress is applied), in accordance with deformation of the piezoelectric device 1, the potential of the first signal line Tpe1 increases with respect to the potential of the second signal line Tpe2. The power generation voltage Vpe is generated on the first signal line Tpe1. On the other hand, when depression of the piezoelectric device 1 is released, the piezoelectric device 1 automatically returns to the initial state, and the power generation voltage Vpe of the first signal line Tpe1 becomes zero.

(Operation of Load Switch Control Circuit)

The load switch control circuit 3 in FIG. 4, as described above, is configured to change the logic level of the output load switch control signal S4 in accordance with an increase or a decrease of the power generation voltage Vpe applied between the power supply node Nc1 and the power supply node Nc2. When the logic level of the load switch control signal S4 is set to a high level or a low level, the load switch 4 is correspondingly set to a conductive state (on state) or a cut off state (off state). When the load switch 4 is set to a conductive state, the power generation voltage Vpe generated between the output node N1 and the output node N2 is supplied to the load 5. As the load 5 consumes a current, the amount of charge stored in the piezoelectric device 1 gradually decreases, causing the value of the power generation voltage Vpe to be reduced. Note that the potential of the power supply node Nc2 when the piezoelectric device is not deformed corresponds to the reference potential of the present disclosure.

The load switch control circuit 3 is set such that a change in the logic level of the output load switch control signal S4 for a change in the input power generation voltage Vpe has hysteresis characteristics. When the value of the power generation voltage Vpe increases from zero to a threshold voltage Vth, the load switch 4 changes from a cut off state to a conductive state. After that, when the value of the power generation voltage Vpe drops to a threshold voltage Vt1 lower than the threshold voltage Vth in accordance with supply of a current to the load 5, the state of the load switch 4 changes from a conductive state to a cut off state. Note that the threshold voltage Vth corresponds to the first threshold voltage of the present disclosure, and the threshold voltage Vt1 corresponds to the second threshold voltage of the present disclosure.

When the switch 3A is in a cut off state, the power generation voltage Vpe is divided by the resistor R1, the resistor R2, and the resistor R3 connected in series between the power supply node Nc1 and the power supply node Nc2. The comparator circuit 32 determines the logic level of the load switch control signal S4 by comparing the potential between the two ends of the resistor R3 with a potential generated by the comparison voltage generation circuit 33.

In accordance with an exemplary embodiment, the values of the resistors R1 to R3 and the value of the comparison voltage are appropriately set such that the threshold voltage Vth (refer to FIG. 1) has a target value. The resistors R1 to R3 connected in series with one another are connected in parallel with the piezoelectric device 1 and, hence, also function as a leak current path of the piezoelectric device 1. Hence, the values of the resistors R1 to R3 are set such that the value of a leak time constant is larger than the value of the charge time constant of the power generation voltage Vpe due to depression of the piezoelectric device 1.

When the value of the power generation voltage Vpe exceeds the threshold voltage Vth, the comparator circuit 32 causes the logic level of the load switch control signal S4 to be changed from a low level to a high level. In response to this change in the load switch control signal S4, the load switch 4 is set to a conductive state, and the power generation voltage Vpe is applied to the output node N1 with the output node N2 as a reference (refer to FIG. 1).

When the load switch control signal S4 is set to a high level, the switch 3A connected in parallel with the resistor R1 is also set to a conductive state, the voltage (power generation voltage Vpe) of the power supply node Nc1 is divided by the resistor R2 and the resistor R3. Compared with the case when the switch 3A is in a cut off state, the value of the voltage across the resistor R3 is increased and, hence, when the value of the power generation voltage Vpe reaches the threshold voltage Vt1 lower than the threshold voltage Vth, the comparator circuit 32 changes the logic level of the load switch control signal S4 from a high level to a low level. In response to this change in the load switch control signal S4, the load switch 4 is set to a cut off state and the supply of the power generation voltage Vpe to the output node N1 is stopped.

Figure 5:
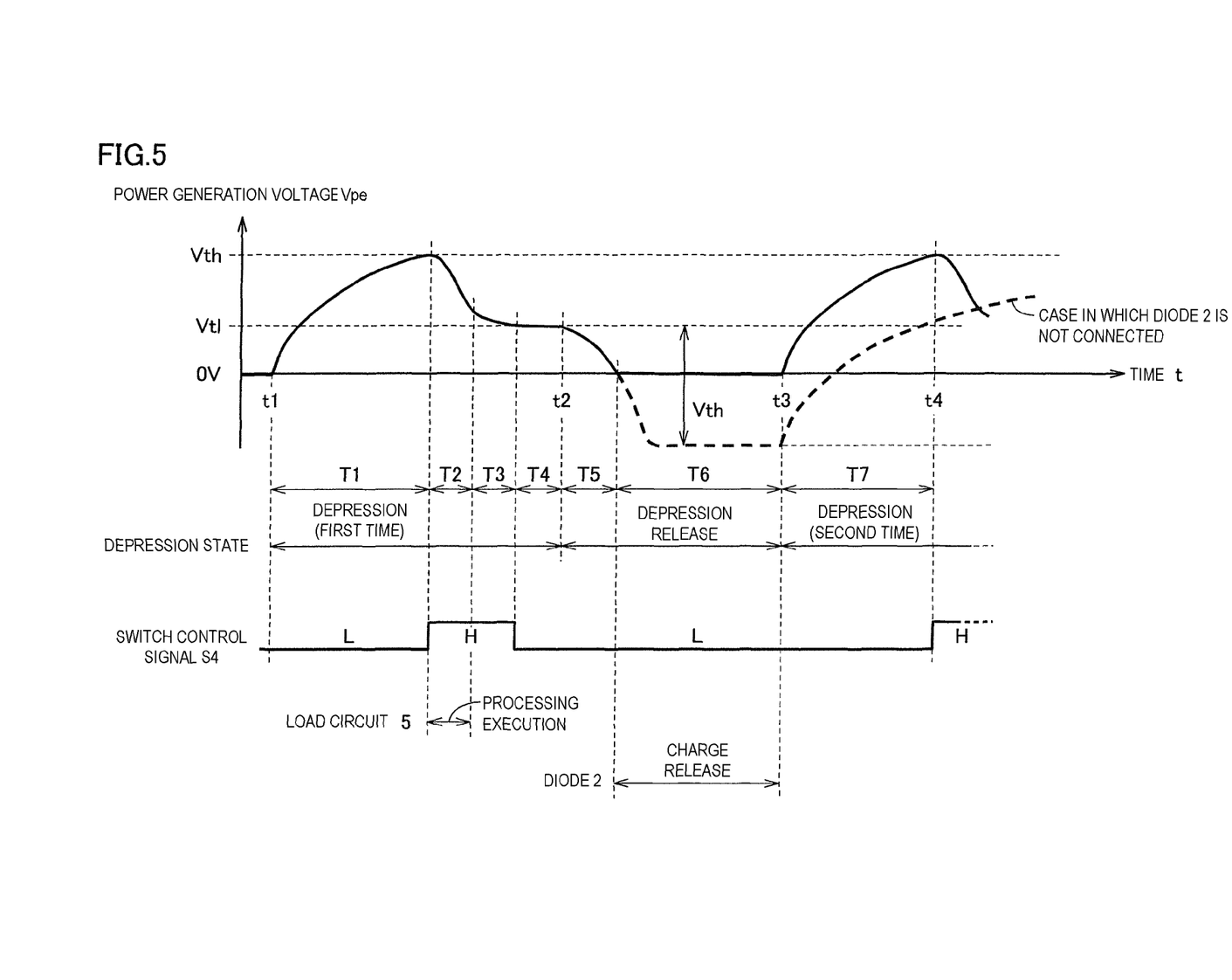
FIG. 5 is a timing diagram illustrating the operation of the piezoelectric power generation module according to the first embodiment.

FIG. 5 is a timing diagram describing the operation of the piezoelectric power generation module 100 in FIG. 1.

The operation of the piezoelectric power generation module 100 will now be described with respect to FIG. 1 and FIG. 5. Specifically, in FIG. 5, the horizontal axis and the vertical axis respectively represent time and the power generation voltage Vpe schematically. The operations of the piezoelectric power generation module 100 illustrated in FIG. 5 are divided into operations as per the following three periods. 1) The first depression period when stress is applied to the piezoelectric device 1 from time t1 to time t2, 2) the period when depression of the piezoelectric device 1 is released from time t2 to time t3, and 3) the second depression period for depressing the piezoelectric device 1 from time t3 to time t4.

(First Depression Period)

When depression of the piezoelectric device 1 is started at time t1, the power generation voltage Vpe increases in accordance with an increase in distortion generated in the piezoelectric device 1. A time period T1 after time t1, when the value of the power generation voltage Vpe reaches the threshold voltage Vth, the load switch control circuit 3 changes the logic level of the load switch control signal S4 from a low level to a high level. In response to this change in the load switch control signal S4, the load switch 4 enters a conductive state and the piezoelectric power generation module 100 starts to supply the power generation voltage Vpe to the load 5.

The load 5 consumes a charge stored in the piezoelectric device 1 during a time period T2 and performs predetermined processing (processing for transmitting a signal to an electronic apparatus). At the end of the time period T2, the value of the power generation voltage Vpe rapidly decreases to near the threshold voltage Vt1. Over a time period T3, the load 5 in an idling state consumes a charge, and at the end of the time period T3, the value of the power generation voltage Vpe reaches the threshold voltage Vt1. When the power generation voltage Vpe reaches the threshold voltage Vt1 at the start time of a time period T4, the load switch control circuit 3 makes the load switch 4 be in a cut off state by setting the logic level of the load switch control signal S4 to a low level, and stops supply of power to the load 5.

(Period of Releasing Depression)

At time t2 when a time period T5 starts, when depression of the piezoelectric device 1 is released, the polarity of a charge generated in the piezoelectric device 1 is inverted, and the potential of the second signal line Tpe2 becomes higher than the potential of the first signal line Tpe1. In other words, the potential of the second signal line Tpe2 becomes negative with respect to the reference potential. Hence, the voltage is clamped as a result of a current flowing from the anode to the cathode of the diode 2, and the charge stored in the piezoelectric device 1 is released through discharging. As a result, the value of the power generation voltage Vpe rapidly decreases from the threshold voltage Vt1 to zero. The value of the power generation voltage Vpe is maintained at zero until the end of a time period T6, that is, at the end of a time period during which depression is released.

(Second Depression Period)

At time t3 when a time period T7 starts, second depression of the piezoelectric device 1 is started. The piezoelectric device 1, similarly to the first depression period, increases the value of the power generation voltage Vpe from zero to the threshold voltage Vth. Also after the time period T7, the piezoelectric power generation module 100 repeats operations of the time period T2 to the time period T6, similarly to the first depression period.

(Waveform for the Case Where the Diode 2 has Been Deleted from the Piezoelectric Power Generation Module 100)

As shown in FIG. 5, the waveform of the power generation voltage Vpe denoted by a dotted line corresponds to a comparative example and is the waveform of the power generation voltage Vpe in the case where the diode 2 has been deleted from the piezoelectric power generation module 100. Hereinafter, the effect of the diode 2 connected in parallel with the piezoelectric device 1 included in the piezoelectric power generation module 100 is described by comparing the waveform of the power generation voltage Vpe denoted by a dotted line, which is a comparative example, with the above-described waveform of the power generation voltage Vpe denoted by a solid line according to the first embodiment.

The waveform of the power generation voltage Vpe during the first depression period from time t1 to time t2 and during the time period T5 included in the period of released depression according to the comparative example is the same as that of the first embodiment and, hence, the description thereof is omitted.

When depression of the piezoelectric device 1 is released at time t2 when the time period T5 starts, the polarity of a charge generated in the piezoelectric device 1 is inverted, and the potential of the second signal line Tpe2 becomes higher than the potential of the first signal line Tpe1. In other words, the potential of Tpe2 becomes negative with respect to the reference potential. The stress applied to the piezoelectric device 1 at time t2 is the inverse of the stress applied to the piezoelectric device 1 during the time period T1.

Hence, a charge which can generate the threshold voltage Vth between the first signal line Tpe1 and the second signal line Tpe2 is induced in the piezoelectric device 1 in which depression is released. As a result, after time t2, the value of the first signal line Tpe1 drops from the threshold voltage Vt1 as much as the threshold voltage Vth. In other words, the value of the first signal line Tpe1 drops to a negative voltage with respect to the reference potential, i.e., a voltage equal to the threshold voltage Vt1 subtracted by the threshold voltage Vth.

When second depression is started at time t3, the voltage of the first signal line Tpe1 starts to increase from a voltage which is negative with respect to the reference potential described above and, hence, cannot reach the threshold voltage Vt1. Hence, the load switch control circuit 3 cannot make the load switch 4 be in a conductive state. As a result, supply of a power to the load 5 cannot be performed, and the load 5 cannot perform desired processing even when the piezoelectric device 1 is depressed.

On the other hand, the piezoelectric power generation module 100 according to the first embodiment includes the diode 2 connected in parallel with the piezoelectric device 1 and, hence, the charge stored by the piezoelectric device 1 after releasing of depression is released through discharging between the first signal line Tpe1 and the second signal line Tpe2 of the piezoelectric device 1. As a result, even when the piezoelectric device 1 is depressed after releasing of depression, it becomes possible for the piezoelectric device 1 to generate the power generation voltage Vpe having a voltage necessary for a processing operation of the load 5.

The effect of the piezoelectric power generation module 100 according to the first embodiment will now be described.

(Reduction in Energy Loss Due to a Full-Wave-Rectifier Circuit)

In the piezoelectric power generation module 100, DC power generated by the piezoelectric device 1 in a depressed state is supplied to the load 5, but DC power generated by the piezoelectric device 1 in which depression is released is not supplied to the load 5. Hence, unlike the existing signal generation apparatus in which AC power generated by a piezoelectric device in a depressed state and a depression-released state is converted into DC power by a full-wave rectifier circuit and supplied to a load, the piezoelectric power generation module 100 does not need a full-wave rectifier circuit (not illustrated) and a charge capacitor (not illustrated).

By removing the full-wave rectifier circuit, charge movement energy loss generated in diodes for forming a full-wave rectifier circuit, i.e., diodes connected in series between the piezoelectric device 1 and the load 5 is reduced. In other words, mechanical potential energy corresponding to the reduced charge movement energy loss is reduced, and a ratio of the load 5 consumption energy to the piezoelectric device 1 power generation energy, i.e., energy utilization efficiency is increased.

Further, by removing the charge capacitor, energy loss caused by charge movement is reduced. When the equivalent capacitance value of the piezoelectric device 1 is Cs, the amount of generated charge is Qs, and the capacitance value of the charge capacitor is Cc, charge energy P1 is given by Equation 1. On the other hand, charge energy P2 in the case of only the piezoelectric device 1 is given by Equation 2.

$$P1 = Qs^2/2(Cc+Cs) \qquad \text{Equation 1:}$$

$$P2 = Qs^2/2Cs \qquad \text{Equation 2:}$$

Since P1<P2, the piezoelectric power generation module 100 that directly drives the load 5 using the piezoelectric device 1 without providing a charge capacitor can supply more charge energy to the load 5 than a general configuration including a rectifier circuit and a charge capacitor.

(Parallel Connection Diode)

The piezoelectric power generation module 100 includes the piezoelectric device 1 and the diode 2 connected in parallel with the piezoelectric device 1. The piezoelectric device 1 depressed to the lowest depression point usually outputs the power generation voltage Vpe having a value higher than or equal to the lowest operation voltage of the load 5, although depending on a balance between the amount of charge generated by the piezoelectric device 1 and charge consumption of the load 5. When depression is released after the processing operation of the load 5, the potential of the first signal line Tpe1 decreases with respect to the second signal line Tpe2 to a negative value with respect to the reference potential, passing through the reference potential, i.e., zero, due to a charge generated in the piezoelectric device 1.

Then, the charge generated in the piezoelectric device 1 flows through the anode to cathode of the diode 2 and is consumed within the piezoelectric device 1, and the voltage of the first signal line Tpe1 of the piezoelectric device 1 is kept at zero also after releasing of depression. As a result, the piezoelectric device 1 depressed after releasing of depression, again outputs the power generation voltage Vpe with a value higher than or equal to the lowest operation voltage of the load 5, whereby normal operation of the load 5 is secured.

(Hysteresis Characteristics)

When the value of the power generation voltage Vpe of the piezoelectric device 1 exceeds the threshold voltage Vth, the load switch control circuit 3 sets the load switch 4 to a conductive state, and supplies a charge stored in the piezoelectric device 1 to the load 5. After that, when the value of the power generation voltage Vpe becomes lower than the threshold voltage Vt1, which is set to be lower than the value of the threshold voltage Vth, due to power consumption of the load 5 or releasing of depression of the piezoelectric device 1, the load switch 4 is set to a cut off state and supply of a charge, i.e., power to the load 5 is stopped.

In this way, as a result of setting being performed such that a change in the conductive state of the load switch 4 has hysteresis characteristics with respect to a change in the input power generation voltage Vpe, power is supplied to the load 5 and the response of a remote controller including the piezoelectric power generation module 100 is speeded up through a single depressing operation onto the piezoelectric device 1.

<Modification of First Embodiment>

Figure 3:
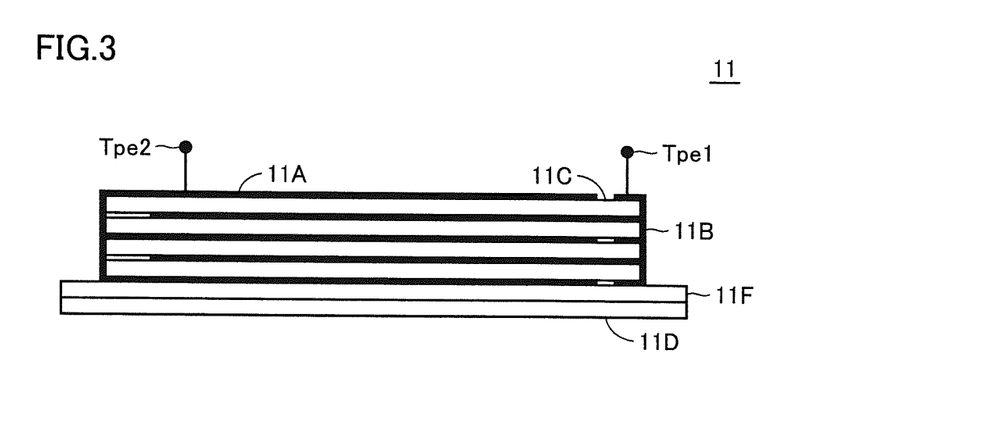
FIG. 3 is a sectional view of a modification of the piezoelectric device according to the first embodiment.

FIG. 3 is a sectional view of a piezoelectric device 11 which is a modification of the piezoelectric device 1 in FIGS. 2(a)-2(c).

In FIG. 3, components denoted by the same symbols as those in FIGS. 2(a)-2(c) have the same configurations or functions as those in FIGS. 2(a)-2(c) and duplicated descriptions thereof are omitted, except it is noted that first electrode 11A corresponds to electrode 1A in FIG. 2, second electrode 11B corresponds to electrode 1B in FIG. 2, and metal plate 11D corresponds to plate 1D in FIG. 2. Moreover, according to the exemplary embodiment 11F can be an insulating layer, for example, that is disposed between the piezoelectric body and the metal plate. Specifically, in FIG. 3, the piezoelectric device 11 has a configuration in which piezoelectric bodies 11C are stacked on top of one another such that charges having the same polarity are generated during depression at surfaces at which the piezoelectric bodies 11C face one another. As a result of the piezoelectric bodies 11C having a stacked configuration, the amount of charge generated by the piezoelectric device 11 is increased and the load 5 (refer to FIG. 1) can be driven for a longer time.

It is further noted that in the embodiments described above, the piezoelectric device 1 is preferably formed of a lead zirconate titanate ceramic, but is not limited to this material. For example, the piezoelectric device 1 may be formed of a piezoelectric material which is a non-lead piezoelectric ceramic, such as a potassium sodium niobate ceramic or an alkali niobate-based ceramic.

Further, in the embodiments described above, the support structure of the piezoelectric device 1 is formed of the two support units 1E, but is not limited to this. For example a configuration may be employed in which one end of the piezoelectric device 1 is held by a cantilever and stress is applied to the other end, which is a free end. Alternatively, by making the piezoelectric device 1 be shaped like a stick one end of which is held by a cantilever, stress is applied to the other end. In other words, the support structure of the piezoelectric device 1 need only have a configuration enabling deformation to be made by depression.

<Second Embodiment>

Figure 6:
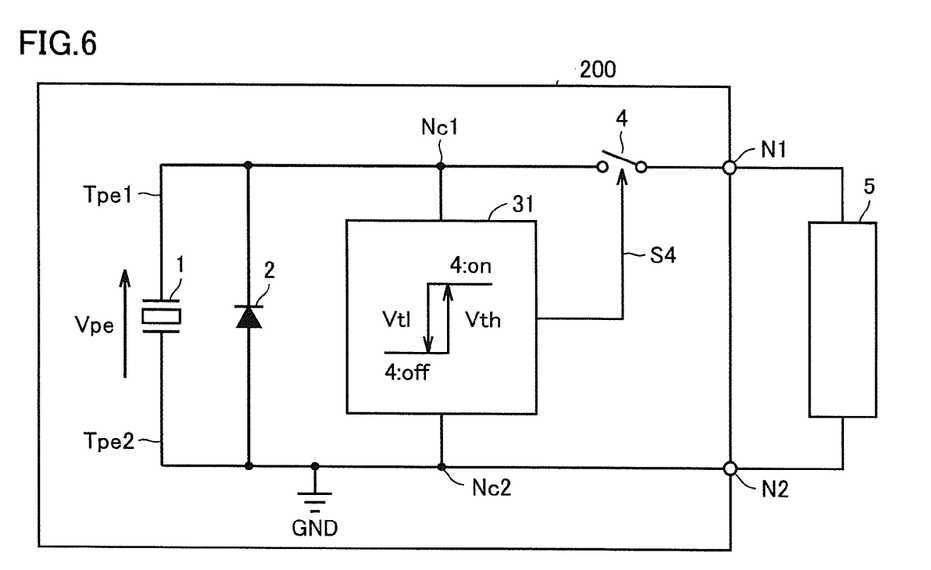
FIG. 6 is a circuit diagram of a piezoelectric power generation module according to a second embodiment.

FIG. 6 is a circuit diagram of a piezoelectric power generation module 200 according to a second embodiment.

In FIG. 6, components denoted by the same symbols as those in FIG. 1 have the same configurations or functions of those in FIG. 1 and duplicated descriptions thereof are omitted. The piezoelectric power generation module 200 illustrated in FIG. 6 corresponds to a configuration obtained by replacing the load switch control circuit 3 in the piezoelectric power generation module 100 in FIG. 1 with a load switch control circuit 31.

Figure 7:
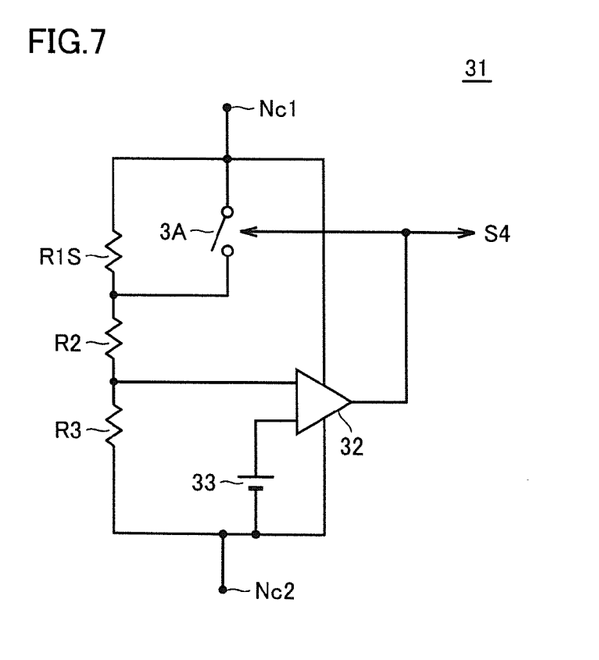
FIG. 7 is a circuit diagram of a load switch control circuit according to the second embodiment.

FIG. 7 is a circuit diagram of the load switch control circuit 31 in FIG. 6.

The load switch control circuit 31 in FIG. 7 corresponds to a configuration obtained by replacing the resistor R1 in the load switch control circuit 3 in FIG. 4 by a temperature compensation device R1S.

In the piezoelectric device 1 (refer to FIGS. 2(a)-2(c)) that uses, for example, PZT (lead zirconate titanate) for the piezoelectric body 1C, the composition is usually adjusted to near a phase transition so as to increase power generation energy and, hence, the values of the capacitance and power generation voltage of the piezoelectric device 1 have considerable temperature characteristics. When the dielectric constant of the piezoelectric body 1C has a positive temperature coefficient, the capacitance value of the piezoelectric device 1 increases and the value of the power generation voltage Vpe of the piezoelectric device 1 decreases in accordance with an increase in the surrounding temperature. As a result, in a high surrounding temperature range (temperature range higher than an ordinary temperature of 25° C.), the value of the power generation voltage Vpe of the piezoelectric device 1 does not reach the threshold voltage Vth, and the load switch 4 is maintained in a cut off state, resulting in a problem in that the power generation voltage Vpe is not supplied to the load 5.

Hence, in the load switch control circuit 31 in FIG. 7, for example, a thermistor is applied to the temperature compensation device R1S, as a device having temperature characteristics in which the resistance value is negative. In accordance with an increase in the surrounding temperature, the resistance value of the temperature compensation device R1S decreases, and the potential at a connection point between the resistor R2 and the resistor R3 increases. As a result, even in a high surrounding temperature range, the comparator circuit 32 causes the logic level of the load switch control signal S4 to be inverted, and the power generation voltage Vpe is supplied to the load 5. In other words, due to the temperature compensation device R1S having characteristics with a negative resistance value, the value of the threshold voltage Vth set in the load switch control circuit 31 is given a negative temperature coefficient.

It is noted that when the dielectric constant of the piezoelectric body 1C has a negative temperature coefficient, a device whose resistance value has a positive temperature coefficient may be used as the temperature compensation device R1S, or, for example, a thermistor having a negative temperature coefficient may be used as R3. Further, instead of making the value of the resistor R1 (refer to FIG. 4) have temperature dependency, a configuration may be employed in which the comparison voltage generated by the comparison voltage generation circuit 33 has temperature dependency.

By employing a temperature compensation device for the value of the threshold voltage set in the load switch control circuit 31, the threshold voltage Vth varies with the temperature. As a result, even in the case where the capacitance value of the piezoelectric device 1 changes with temperature, the power generation voltage Vpe can be reliably supplied to the load 5 independently of the surrounding temperature. Note that in the embodiment described above, the resistor R1 in FIG. 4 has been replaced with the temperature compensation device R1S, but is not limited to this. Similar effect can be obtained also by replacing the resistor R2 or the resistor R3 in FIG. 4 with a temperature compensation device.

<Third Embodiment>

Figure 8:
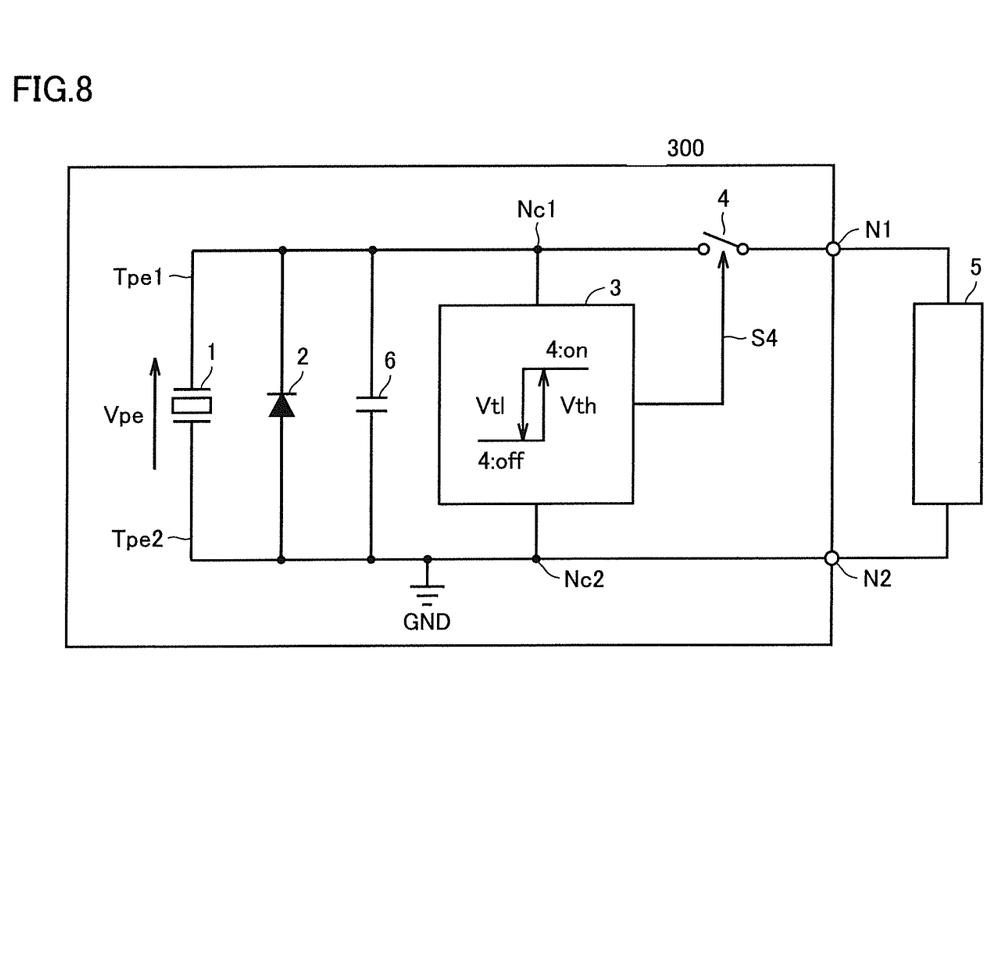
FIG. 8 is a circuit diagram of a piezoelectric power generation module according to a third embodiment.

FIG. 8 is a circuit diagram of a piezoelectric power generation module 300 according to a third embodiment.

In FIG. 8, components denoted by the same symbols as those in FIG. 1 have the same configurations or functions of those in FIG. 1 and duplicated descriptions thereof are omitted. The piezoelectric power generation module 300 illustrated in FIG. 8 corresponds to a configuration obtained by connecting a storage capacitor 6 between the first signal line Tpe1 and the second signal line Tpe2 in the piezoelectric power generation module 100 illustrated in FIG. 1. Note that the storage capacitor 6 corresponds to the capacitor device of the present disclosure.

As described above, the capacitance value and the value of the power generation voltage Vpe of the piezoelectric device 1 vary depending on the surrounding temperature in some cases. For example, in a low surrounding temperature range (temperature range lower than an ordinary temperature of 25° C.), it is feared that an over voltage may be applied to the load 5 when the value of the power generation voltage Vpe increases more than in the case of ordinary temperature due to a decrease in the capacitance value of the piezoelectric device 1. By connecting the storage capacitor 6 in parallel with the piezoelectric device 1, the charge generated by the piezoelectric device 1 is distributed to the piezoelectric device 1 and the storage capacitor 6, and an increase in the power generation voltage Vpe is suppressed.

The piezoelectric power generation module 300 has a configuration which is the combination of the storage capacitor 6 and the load switch control circuit 3 without temperature compensation of the threshold voltage Vth; however, the load switch control circuit 31 with temperature compensation of the threshold voltage Vth of the piezoelectric power generation module 200 illustrated in FIG. 6 may be combined with the storage capacitor 6. In that case, the undesirable problem which may appear in a high surrounding temperature range and the above-described undesirable problem of over voltage being applied which may appear in a low temperature range are solved.

The embodiments disclosed here are illustrative in all points and are not considered to be restrictive. The scope of the present invention is shown by the claims, and it is intended that all the modifications that have equivalent meanings and that are within the scope of the claims are included.

REFERENCE SIGNS LIST 1 piezoelectric device
1A electrode
1B electrode
1C piezoelectric body
1D metal plate
1E support unit
2 diode
3 load switch control circuit
4 load switch
5 load
6 storage capacitor
11 piezoelectric body
11C piezoelectric bodies
3A switch
31 load switch control circuit
32 comparator circuit
33 comparison voltage generation circuit
100 piezoelectric power generation module
200 piezoelectric power generation module
300 piezoelectric power generation module
GND reference potential
N1, N2 output nodes
Nc1, Nc2 power supply nodes
R1-R3 resistors
R1S temperature compensation device
S4 load switch control signal
Tpe1 first signal line
Tpe2 second signal line
Vpe power generation voltage
Vth, Vtl threshold voltages

The invention claimed is:

1. A piezoelectric power generation device comprising:
a piezoelectric device;
a diode including a cathode and an anode connected in parallel to the piezoelectric device;
a switch control circuit including a first and second input terminals respectively connected to the cathode and the anode of the diode, and an output terminal that outputs a switch control signal; and
a switch connected to the first input terminal of the switch control circuit and that switches between a conductive state and an off state based on the switch control signal,
wherein the piezoelectric device is a power generating device, and the switch is set to the conductive state when a voltage across the piezoelectric device is greater than a first threshold voltage that is greater than a reference potential, and
wherein the piezoelectric device generates a voltage at a terminal of the piezoelectric device in response to a load being applied to the piezoelectric device, and the voltage across the piezoelectric device becomes the reference potential when the load applied to the piezoelectric device is released.

2. The piezoelectric power generation device according to claim 1, wherein the switch is set to the off state when the voltage across the piezoelectric device is equal to or less than a second threshold voltage lower than the first threshold voltage.

3. The piezoelectric power generation device according to claim 1, wherein the piezoelectric device comprises a piezoelectric body, a metal plate and a pair of electrodes disposed on opposing sides of the piezoelectric body.

4. A piezoelectric power generation device, comprising:
a piezoelectric device;
a diode including a cathode and an anode connected in parallel to the piezoelectric device:
a switch control circuit including a first and second input terminals respectively connected to the cathode and the anode of the diode, and an output terminal that outputs a switch control signal; and
a switch connected to the first input terminal of the switch control circuit and that switches between a conductive state and an off state based on the switch control signal,
wherein the switch control circuit includes a comparator circuit and a temperature compensation device connected in parallel with the first and second input terminals of the switch control circuit.

5. The piezoelectric power generation device according to claim 4, wherein the switch control circuit further includes an additional switch that is connected in parallel with the temperature compensation device and that switches between a conductive state and an off state in synchronization with a state of the switch.

6. The piezoelectric power generation device according to claim 1, further comprising a capacitor connected in parallel with the first and second input terminals of the switch control circuit.

7. A piezoelectric power generation device, comprising:
a piezoelectric device;
a diode including a cathode and an anode connected in parallel to the piezoelectric device;
a switch control circuit including a first and second input terminals respectively connected to the cathode and the anode of the diode, and an output terminal that outputs a switch control signal; and
a switch connected to the first input terminal of the switch control circuit and that switches between a conductive state and an off state based on the switch control signal,
wherein the switch control circuit comprises:
first, second and third resistors connected in series between the first and second input terminals;
an additional switch coupled to the first input terminal and a node between the first and second resistors; and
a comparator have a non-inverting input coupled to a node between the second and third resistors, an inverting input that receives a voltage threshold, and an output coupled to the output terminal of the switch control circuit.

8. The piezoelectric power generation device according to claim 7, wherein the first resistor is a temperature compensation device.

9. The piezoelectric power generation device according to claim 1, further comprising a load coupled in parallel to the piezoelectric device when the switch is in the conductive state.

10. A remote controller comprising:
a piezoelectric power generation device, including:
a piezoelectric device,
a diode including a cathode and an anode connected in parallel to the piezoelectric device,
a switch control circuit including a first and second input terminals respectively connected to the cathode and the anode of the diode, and an output terminal that outputs a switch control signal, and
a switch connected to the first input terminal of the switch control circuit and that switches between a conductive state and an off state based on the switch control signal; and
an RF circuit connected to the piezoelectric power generation device and configured to communicate data during a period after a voltage at a terminal of the piezoelectric device exceeds a first threshold voltage and before the voltage reaches a second threshold voltage lower than the first threshold voltage.

11. The remote controller according to claim 10, wherein the piezoelectric device of the piezoelectric power generation device is a power generating device, and the switch is set to the conductive state when a voltage across the piezoelectric device is greater than first threshold voltage.

12. The remote controller according to claim 11, wherein the switch is set to the off state when the voltage across the piezoelectric device is equal to or less than a second threshold voltage lower than the first threshold voltage.

13. The remote controller according to claim 12, wherein first threshold voltage is greater than a reference potential.

14. The remote controller according to claim 13, wherein the piezoelectric device generates a voltage at a terminal of the piezoelectric device in response to a load being applied to the piezoelectric device, and the voltage across the piezoelectric device becomes the reference potential when the load applied to the piezoelectric device is released.

15. The remote controller according to claim 10, wherein the switch control circuit of the piezoelectric power generation device includes a comparator circuit and a temperature compensation device connected in parallel with the first and second input terminals of the switch control circuit.

16. The remote controller according to claim 15, wherein the switch control circuit further includes an additional switch that is connected in parallel with the temperature compensation device and that switches between a conductive state and an off state in synchronization with a state of the switch.

17. The remote controller according to claim 10, wherein the piezoelectric power generation device further comprises a capacitor connected in parallel with the first and second input terminals of the switch control circuit.

* * * * *